United States Patent
Coccioli et al.

(10) Patent No.: US 6,818,985 B1
(45) Date of Patent: Nov. 16, 2004

(54) EMBEDDED ANTENNA AND SEMICONDUCTOR DIE ON A SUBSTRATE IN A LAMINATE PACKAGE

(75) Inventors: Roberto Coccioli, Simi Valley, CA (US); Mohamed A. Megahed, San Diego, CA (US); Trang N. Trinh, Cypress, CA (US); Larry D. Vittorini, Irvine, CA (US); John S. Walley, Ladera Ranch, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 13 days.

(21) Appl. No.: 10/026,134

(22) Filed: Dec. 22, 2001

(51) Int. Cl.⁷ .............................. H05K 7/20; H01Q 1/38; H01L 23/14
(52) U.S. Cl. ....................... 257/728; 257/421; 257/702; 257/724; 257/725; 257/668; 257/700; 257/701; 257/685; 257/528; 257/240; 257/737; 257/738; 257/734; 257/723; 343/700 MS; 343/767; 361/720
(58) Field of Search ................................ 257/728, 725, 257/724, 734, 737, 738, 668, 421, 240, 700, 701, 702, 784, 685, 723, 588, 684; 343/700 MS, 767; 361/720

(56) References Cited

U.S. PATENT DOCUMENTS

| | | | | |
|---|---|---|---|---|
| 5,640,048 A | * | 6/1997 | Selna ........................... | 357/738 |
| 5,757,074 A | * | 5/1998 | Matloubian et al. ......... | 257/702 |
| 6,114,962 A | * | 9/2000 | Wiklof et al. ............ | 340/572.8 |
| 6,236,366 B1 | * | 5/2001 | Yamamoto et al. .. | 343/700 MS |
| 6,246,327 B1 | * | 6/2001 | Eberhardt ................. | 340/572.1 |
| 6,265,977 B1 | * | 7/2001 | Vega et al. ............... | 340/572.7 |
| 6,353,540 B1 | * | 3/2002 | Akiba et al. ................. | 361/794 |
| 6,388,623 B1 | * | 5/2002 | Sakota et al. ......... | 343/700 MS |
| 6,396,135 B1 | * | 5/2002 | Narvaez et al. ............. | 257/678 |
| 6,421,013 B1 | * | 7/2002 | Chung ................. | 343/700 MS |
| 6,534,711 B1 | * | 3/2003 | Pollack ....................... | 174/52.2 |
| 6,582,979 B2 | * | 6/2003 | Coccioli et al. .............. | 438/25 |
| 2001/0016251 A1 | * | 8/2001 | Sugimoto .................... | 428/209 |
| 2002/0027531 A1 | * | 3/2002 | Brown et al. ................ | 343/895 |
| 2002/0050635 A1 | * | 5/2002 | Ogura et al. ................ | 257/686 |
| 2002/0079568 A1 | * | 6/2002 | Degani et al. .............. | 257/686 |
| 2002/0125546 A1 | * | 9/2002 | Muta ........................... | 257/531 |
| 2002/0159242 A1 | * | 10/2002 | Nakatani et al. ............ | 361/760 |
| 2002/0167084 A1 | * | 11/2002 | Coccioli et al. ............. | 257/732 |
| 2003/0030985 A1 | * | 2/2003 | Sakai .......................... | 361/720 |

* cited by examiner

*Primary Examiner*—Alexander Oscar Williams
(74) *Attorney, Agent, or Firm*—Farjami & Farjami LLP

(57) ABSTRACT

According to one exemplary embodiment, a structure comprises a laminate substrate having a top surface for receiving a semiconductor die. The structure further comprises an antenna element situated on the top surface of the laminate substrate, where the antenna element is coupled to a laminate substrate bond pad. For example, the antenna element may also be coupled to the laminate substrate bond pad by a trace on the top surface of the laminate substrate. According to this exemplary embodiment, the structure further comprises a bonding wire that provides an electrical connection between the laminate substrate bond pad and a semiconductor die bond pad. For example, the input impedance of the antenna element coupled to the laminate substrate bond pad may match the output impedance at the semiconductor die bond pad. The structure may further comprise a capacitor coupled to the antenna element.

19 Claims, 3 Drawing Sheets

EMBEDDED ANTENNA AND SEMICONDUCTOR DIE ON A SUBSTRATE IN A LAMINATE PACKAGE

BACKGROUND OF THE INVENTION

1. Field of the Invention

The present invention is generally in the field of embedded antennas. More specifically, the present invention is in the field of embedded antennas in semiconductor die packaging.

2. Background Art

The increasing need for mobility and the expanding range of wireless services are driving a growing consumer demand for small size, high-performance and feature-rich wireless communications devices, such as wireless handsets, at competitive prices. In order to meet this consumer demand, the design goal of manufacturers of these wireless communications devices is to achieve the highest performance with the least amount of implementation complexity. Manufacturers can reduce implementation complexity by optimizing the integration of the various components that are used in the manufacture of the wireless communication devices. However, one wireless communication device component that has not been optimized yet from and a size and integration perspective is the antenna. Most of the antenna configurations currently in use consist of a simple rigid metallic wire protruding from the wireless communication device.

The simple rigid metallic wire antenna mentioned above requires a standard 50.0 ohm transmission line to connect the antenna to the transceiver section of a wireless communication device. However, since the antenna does not always present a 50.0 ohm impedance to the transceiver, an impedance matching circuit is required to match the antenna impedance to the 50.0 impedance of the transceiver. The required impedance matching circuit increases the manufacturing cost of the wireless communication device. Additionally, the 50.0-ohm transmission line discussed above can produce line losses that decrease the performance of the wireless communication device.

One approach for integrating an antenna in a wireless communication device involves printing a patch or dipole antenna on the main printed circuit board of the wireless communication device. Although the above approach provides an integrated antenna on the main printed circuit board, the resulting integrated antenna has the undesirable effect of taking up valuable real estate on the main printed circuit board.

Another approach utilizes miniaturized antennas in a stand-alone configuration for Global Positioning System ("GPS") and Bluetooth applications. Although these miniaturized antennas have a small size, they still require a standard 50.0 ohm transmission line and impedance matching circuit for proper coupling to the transceiver section of the wireless communication device. As discussed above, the impedance matching circuit increases the cost of the wireless communication device. Also, as discussed above, the 50.0-ohm transmission line can produce line losses that decrease the performance of the wireless communication device. Further, a stand-alone antenna must be attached to a printed circuit board in the wireless communication device, and thus requires an additional assembly cost.

A slot antenna for semiconductor applications was reported in a paper by H. Rogier et al., "Design of an On-Package Slot Antenna for Bluetooth Applications," Proceedings of the 9$^{th}$ IEEE Topical Meeting on Electrical Performance of Electronic Packaging, pp. 292–295, Oct. 23–25, 2000 (European Patent no. 120418N pending).

Therefore, there exists a need for an antenna that has a small size and is integrated in wireless communication device. More specifically, there exists a need for an antenna that does not take up real estate on the main printed circuit board of the wireless communication device, and does not require the additional assembly cost of a stand-alone antenna. Moreover, there exists a need for an antenna that does not require an impedance matching circuit to match the antenna impedance to the impedance of a transceiver in a wireless communications device.

SUMMARY OF THE INVENTION

The present invention is directed to a laminate package embedded antenna. The present invention overcomes the need in the art for a small size, low cost antenna that is integrated in a communication device by fabricating an antenna on a laminate substrate which also houses a semiconductor die coupled to the antenna.

According to one exemplary embodiment, a structure comprises a laminate substrate having a top surface for receiving a semiconductor die. For example, the laminate substrate can be an organic or a ceramic laminate material. The structure further the comprises an antenna element situated on the top surface of the laminate substrate, where the antenna element is coupled to a laminate substrate bond pad. For example, the antenna element may comprise copper. By way of further example, the antenna element may be a square metal pad, or may form a slot line, meander line, or patch pattern. For example, the antenna element may also be coupled to the laminate substrate bond pad by a trace on the top surface of the laminate substrate.

According to this exemplary embodiment, the structure further comprises a bonding wire that provides an electrical connection between the laminate substrate bond pad and a semiconductor die bond pad. For example, an input impedance of the antenna element coupled to the laminate substrate bond pad may match an output impedance at the semiconductor die bond pad. The structure may further comprise a capacitor coupled to the antenna element. For example, the capacitor may be an embedded capacitor.

DETAILED DESCRIPTION OF THE INVENTION

The present invention is directed to a laminate package embedded antenna. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
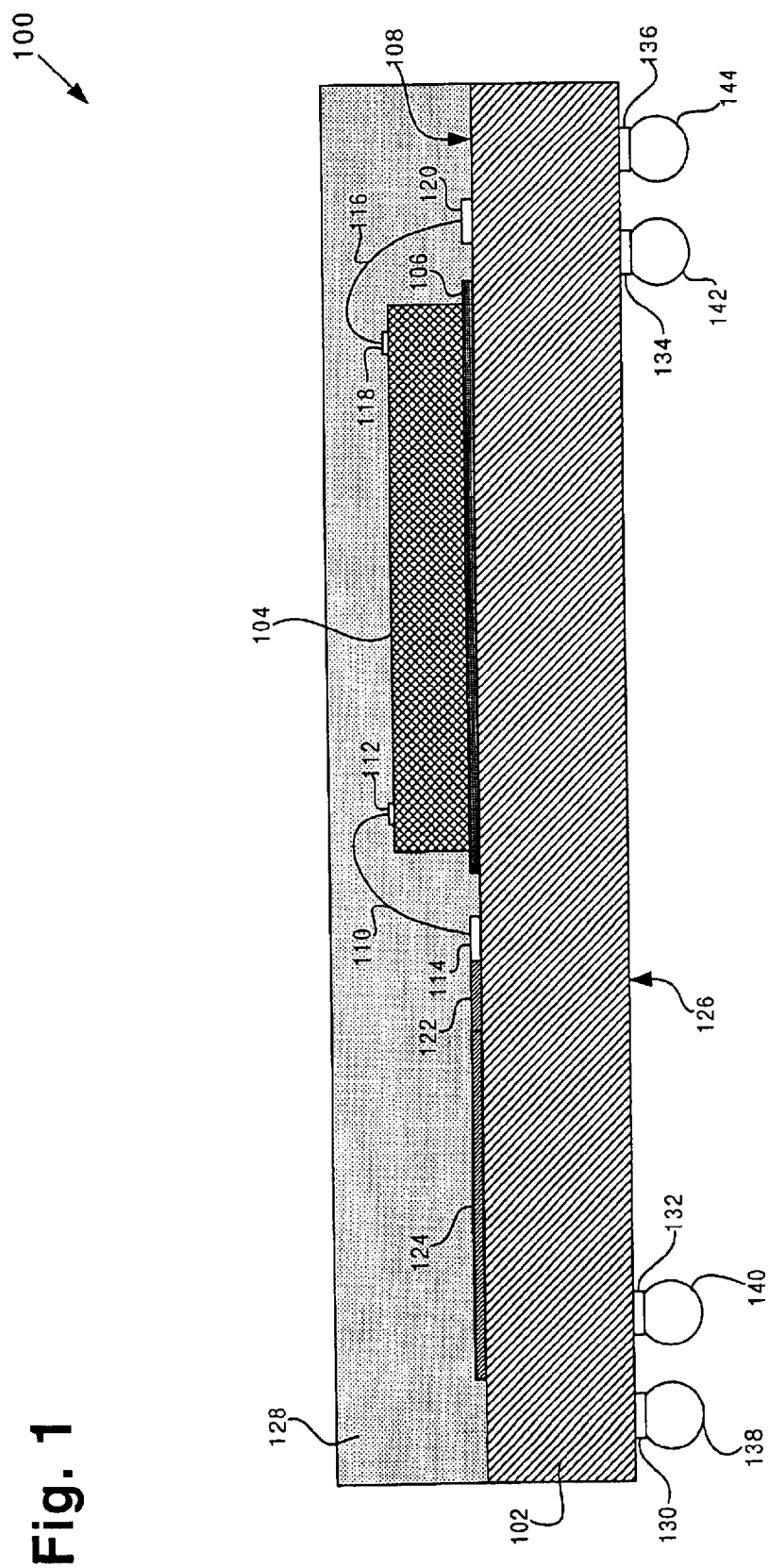
FIG. 1 illustrates a cross-sectional view of an exemplary structure in accordance with one embodiment of the present invention.

Structure 100 in FIG. 1 illustrates a cross-sectional view of an exemplary structure in accordance with one embodiment of the present invention. Structure 100 includes laminate substrate 102, which provides support for semiconductor die 104. It is noted that a "semiconductor die," such as semiconductor die 104, is also referred to as a "die," a "chip," or a "semiconductor chip" in the present application. Laminate substrate 102 can comprise an organic material such as polytetrafluoroethylene material or an FR4 based laminate material. In one embodiment, laminate substrate 102 can comprise a ceramic laminate material.

Laminate substrate 102 can comprise metal layers, not shown in FIG. 1, to shield antenna element 124 from the environment and provide a ground plane for antenna element 124. In one embodiment, the metal layers in laminate substrate 102 can form a "hole" underneath antenna 124 to allow radiation to be emitted and received by antenna element 124. In another embodiment, antenna element 124 can be situated on bottom surface 126 of laminate substrate 102 and semiconductor die 104 can be situated on top surface 108 of laminate substrate 102. In such instance, a metal layer in laminate substrate 102 can shield semiconductor die 104 from radiation emitting from antenna element 124 and provide a ground plane for antenna element 124.

As shown in FIG. 1, semiconductor die 104 is attached to die attach pad 106 on top surface 108 of laminate substrate 102. Die attach pad 106 can be AUS-5 solder mask; however, die attach pad 106 may comprise other materials. Semiconductor die 104 is attached to die attach pad 106 by a die attach material, not shown in FIG. 1, such as silver-filled epoxy or bismalemide. Generally the die attach material can be an electrically conductive or electrically insulative, thermoset adhesive, or a combination thereof.

Also shown in FIG. 1, a first end of bonding wire 110 is bonded to semiconductor die bond pad 112 on semiconductor die 104, and a second end of bonding wire 110 is bonded to laminate substrate bond pad 114. Thus, bonding wire 110 provides an electrical connection between semiconductor die bond pad 112 and laminate substrate bond pad 114. Bonding wire 110 can be gold or can comprise other metals such as aluminum. The diameter of bonding wire 110 can be 30.0 microns or other diameter of choice. A first end of bonding wire 116 is bonded to semiconductor die bond pad 118 on semiconductor die 104, and a second end of bonding wire 116 is bonded to laminate substrate bond pad 120. Bonding wire 116 is similar to bonding wire 110 discussed above, and can comprise the same material as bonding wire 110.

As shown in FIG. 1, laminate substrate bond pad 114 is fabricated on top surface 108 of laminate substrate 102. In structure 100, laminate substrate bond pad 114 can comprise nickel-plated copper. Laminate substrate bond pad 114 can further comprise a layer of gold plating over the nickel-plated copper. However, laminate substrate bond pad 114 can comprise other metals, such as aluminum, molybdenum, tungsten, or gold. Laminate substrate bond pad 120 is fabricated on top surface 108 of laminate substrate 102. Laminate substrate bond pad 120 is similar to laminate substrate bond pad 114 discussed above, and comprises the same material as laminate substrate bond pad 114.

Also shown in FIG. 1, a first end of trace 122 is connected to laminate substrate bond pad 114, and a second end of trace 122 is connected to antenna element 124. Trace 122 is fabricated on top surface 108 of laminate substrate 102, and electrically connects laminate substrate bond pad 114 to antenna element 124. Trace 122 can comprise aluminum or other metal such as copper.

As shown in FIG. 1, antenna element 124 is fabricated on top surface 108 of laminate substrate 102. Antenna element 124 can be fabricated on top surface 108 of laminate substrate 102 utilizing methods known to one of ordinary skill in the art. For example, a mask can be used to pattern conductors on a copper metallization layer on top surface 108 of laminate substrate 102. The excess copper can be etched away, resulting in a defined metal pattern that can include, for example, antenna element 124.

In another embodiment, antenna element 124 can be fabricated on bottom surface 126 of laminate substrate 102. In yet another embodiment, antenna element 124 can be fabricated in a metal layer inside laminate substrate 102. Antenna element 124 can be copper, or can comprise other metals such as aluminum or gold. In one embodiment, antenna element 124 can comprise copper covered by a thin layer of gold.

In the present embodiment, antenna element 124 can have a square shape. For example, each side of antenna element 124 can be 8.0 millimeters. In the above example, an 8.0 millimeter by 8.0 millimeter size allows antenna element 124 to operate at a frequency of approximately 2.0 GHz. By way of another example, each side of antenna element 124 can be 9.0 millimeters. In another embodiment, antenna element 124 can be a different shape, such as a rectangle. Antenna element 124 can have a thickness of approximately 25.0 microns. Antenna element 124 can comprise a patch pattern, a meander line pattern, a slot line pattern, or a combination thereof.

Antenna element 124 can be "loaded" by coupling a capacitor, not shown in FIG. 1, to antenna element 124 to change its (i.e. antenna element 124) operating frequency. By way of background, "loading" allows an antenna element to operate at a higher frequency for a given size antenna element. For example, without "loading," a straight or trace antenna requires a size of approximately 35.0 centimeters to operate at a frequency of 2.0 GHz. However, with "loading," the 8.0 millimeter by 8.0 millimeter antenna element discussed above can operate at a frequency of approximately 2.4 GHz. Antenna element 124 can be "loaded" by coupling a discrete capacitor, not shown in FIG. 1, to antenna element 124. In one embodiment, antenna element 124 can be "loaded" by coupling an embedded capacitor to antenna element 124.

Antenna element 124 is electrically connected to semiconductor die bond pad 112 by bonding wire 110, laminate substrate bond pad 114 and trace 122. In other words, semiconductor die bond pad 112 "drives" antenna element 124. In the present invention, the input impedance of antenna element 124 can be adjusted to match the output impedance at semiconductor die bond pad 112. For example, a power amplifier integrated in semiconductor die 104 may have a 10.0 ohm output impedance at semiconductor die bond pad 112. The input impedance of antenna element 124 can thus be adjusted to match the 10.0 ohm output impedance of the power amplifier at semiconductor die bond pad 112. Thus, the present invention allows the input impedance of antenna element 124 to be adjusted to match a desired output impedance at semiconductor die bond pad 112 without the use of costly impedance matching circuitry.

Also, antenna element 124 is situated in close proximity to semiconductor die 104 on top surface 108 of laminate substrate 102. Accordingly, the line losses generated in the connection between antenna element 124 and semiconductor die bond pad 112 are effectively minimized. Additionally, by fabricating antenna element 124 on top surface 108 of laminate substrate 102, and thus integrating antenna element 124 in structure 100, the present invention avoids the cost of having to assembly antenna element 124 as a discrete component.

Also shown in FIG. 1, mold compound 128 encapsulates and thereby protects semiconductor die 104, bonding wires 110 and 116, and antenna element 124 from chemical contamination or physical damage during use. Mold compound 128 can comprise various chemical compounds, such as multifunctional epoxy, novolac, and biphenyl resin or a combination thereof.

Figure 2A:
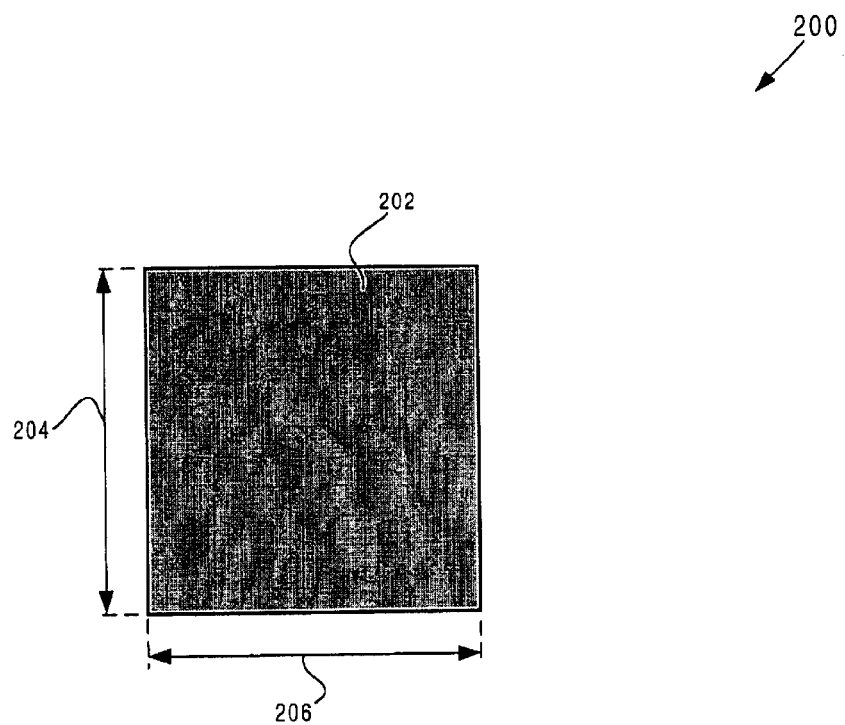
FIG. 2A illustrates a top view of an exemplary antenna element according to an embodiment of the present invention.

Further shown in FIG. 1, laminate substrate ball pads 130, 132, 134, and 136 are fabricated on bottom surface 126 of laminate substrate 102. Laminate substrate ball pads 130, 132, 134, and 136 can be copper; however, laminate substrate ball pads 130, 132, 134, and 136 can comprise other metals, such as aluminum, molybdenum, tungsten, or gold. Solder balls 138, 140, 142, and 144, respectively, are situated on laminate substrate ball pads 130, 132, 134, and 136. Solder balls 138, 140, 142, and 144, respectively, can provide an electrical connection between laminate substrate ball pads 130, 132, 134, and 136 and a printed circuit board or other structure not shown in FIG. 1. In another embodiment, "lands" can be fabricated on bottom surface 126 of laminate substrate 102 to electrically connect structure 100 to a printed circuit board. In such instance, the "lands" can be connected to the printed circuit board by solder. Antenna element 200 in FIG. 2A illustrates a top view of an exemplary antenna element in accordance with one embodiment of the present invention. For example, antenna element 200 in FIG. 2A can correspond to antenna element 124 in FIG. 1. Thus, similar to antenna element 124, antenna element 200 can be fabricated on the top surface of a laminate substrate, such as laminate substrate 102 in FIG. 1, and can be electrically connected to a semiconductor die bond pad, such as semiconductor die bond pad 112.

FIG. 2A shows top surface 202 of antenna element 200, which provides a surface for emitting or receiving electromagnetic radiation. In FIG. 2A, antenna element 200 comprises a "plate" pattern. Antenna element 200 can comprise similar materials as antenna element 124 in FIG. 1. As shown in FIG. 2A, width 204 refers to the width of antenna element 200 in the "x" direction. By way of example, width 204 may have a value of approximately 8.0 millimeters. The shape of antenna element 200 can be square. In another embodiment, the shape of antenna element 200 can be rectangular. Also shown in FIG. 2A, length 206 refers to the length of antenna element 200 in the "y" direction. By way of example, length 206 might have a value of approximately 8.0 millimeters. The thickness of antenna element 200 can be approximately 25.0 microns.

Figure 2B:
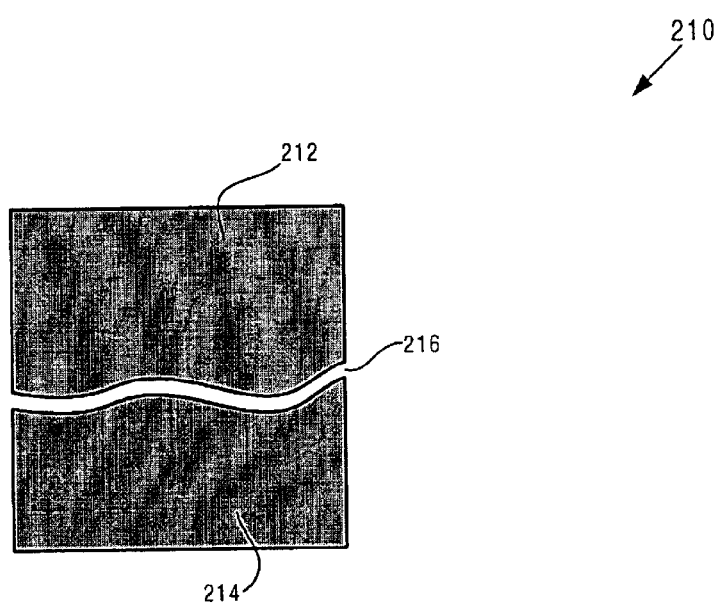
FIG. 2B illustrates a top view of an exemplary antenna element according to an embodiment of the present invention.

Antenna element 210 in FIG. 2B illustrates a top view of an exemplary antenna element in accordance with one embodiment of the present invention. For example, antenna element 210 in FIG. 2B can correspond to antenna element 124 in FIG. 1. Thus, similar to antenna element 124, antenna element 210 can be fabricated on the top surface of a laminate substrate, such as laminate substrate 102 in FIG. 1. Antenna element 210 can be electrically connected to a semiconductor die bond pad, such as semiconductor die bond pad 112. In FIG. 2B, antenna element 210 comprises a slot line pattern.

In FIG. 2B, antenna element 210 comprises top section 212, bottom section 214, and slot 216. Slot 216 is situated between top section 212 and bottom section 214. Top section 212 can be copper, or can comprise other metals such as aluminum or gold. In one embodiment, top section 212 can comprise copper covered by a thin layer of gold. Bottom section 214 can comprise the same materials as top section 212. The thickness of top section 212 and bottom section 214 can be approximately 25.0 microns.

Antenna element 210 produces an electric field excitation and a magnetic field excitation, which complement each other. For example, an electric field is generated from the metal surfaces of top section 212 and bottom section 214, and a magnetic field is generated by slot 216. Thus, antenna element 210 operates by emitting magnetic radiation through slot 216 rather than electric radiation.

Figure 3:
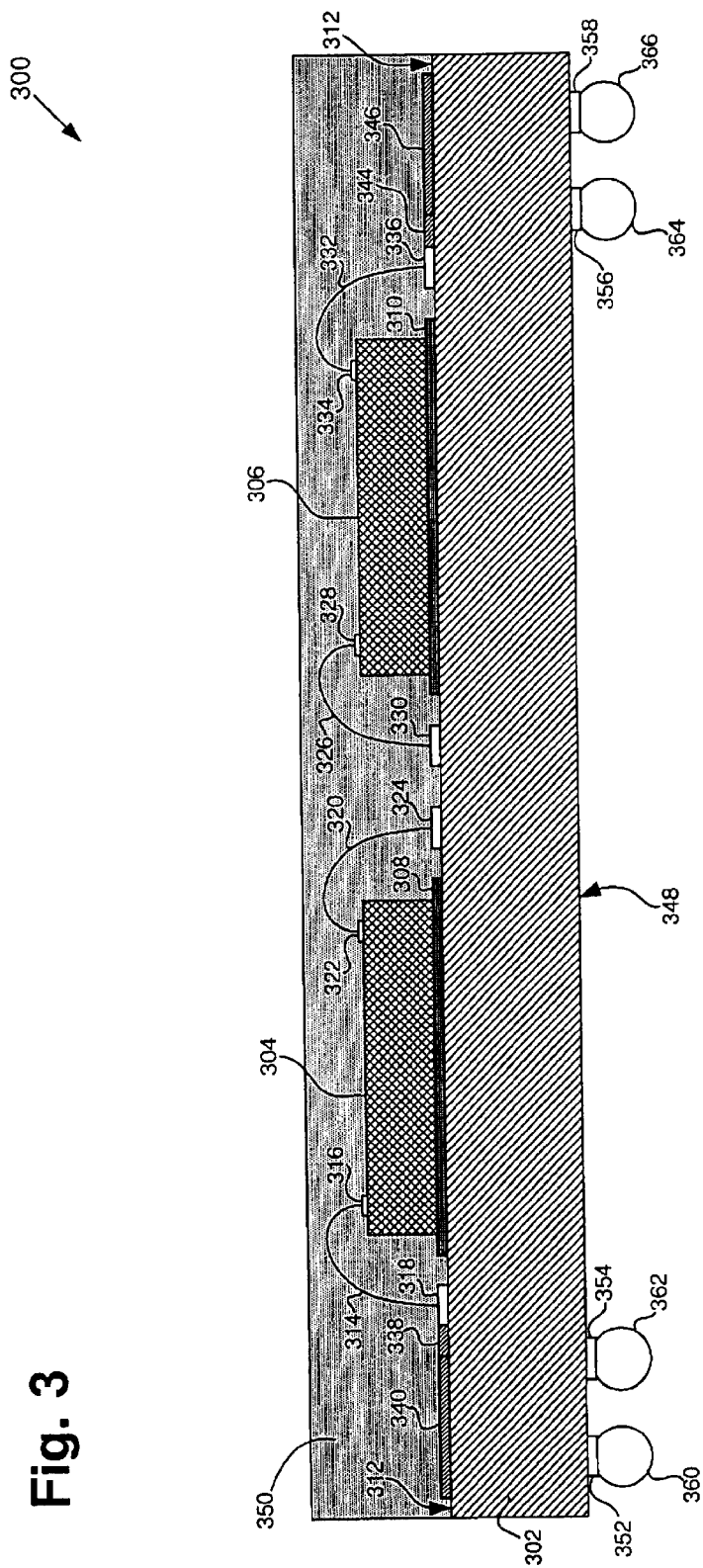
FIG. 3 illustrates a cross-sectional view of an exemplary structure in accordance with one embodiment of the present invention.

Structure 300 in FIG. 3 illustrates a cross-sectional view of an exemplary structure in accordance with one embodiment of the present invention. Structure 300 includes laminate substrate 302, which provides support for semiconductor dies 304 and 306. Laminate substrate 302 is similar to laminate substrate 102 in FIG. 1, and can comprise the same materials as laminate substrate 102.

As shown in FIG. 3, semiconductor dies 304 and 306, respectively, are attached to die attach pads 308 and 310 on top surface 312 of laminate substrate 302. Die attach pads 308 and 310 are similar to die attach pad 106 in FIG. 1, and can comprise the same materials as die attach pad 106. Semiconductor dies 304 and 306, respectively, are attached to die attach pads 308 and 310 by a die attach material, not shown in FIG. 3, such as silver-filled epoxy or bismalemide. Generally the die attach material can be an electrically conductive or electrically insulative, thermoset adhesive, or a combination thereof Also shown in FIG. 3, a first end of bonding wire 314 is bonded to semiconductor die bond pad 316 on semiconductor die 304, and a second end of bonding wire 314 is bonded to laminate substrate bond pad 318. Thus, bonding wire 314 provides an electrical connection between semiconductor die bond pad 316 and laminate substrate bond pad 318. A first end of bonding wire 320 is bonded to semiconductor die bond pad 322 on semiconductor die 304, and a second end of bonding wire 320 is bonded to laminate substrate bond pad 324. Thus, bonding wire 320 also provides an electrical connection between semiconductor die bond pad 322 and laminate substrate bond pad 324. Bonding wires 314 and 320 are similar to bonding wire 110 in FIG. 1, and can comprise the same material as bonding wire 110.

Further shown in FIG. 3, a first end of bonding wire 326 is bonded to semiconductor die bond pad 328 on semiconductor die 306, and a second end of bonding wire 326 is bonded to laminate substrate bond pad 330. Thus, bonding wire 326 provides an electrical connection between semiconductor die bond pad 328 and laminate substrate bond pad 330. A first end of bonding wire 332 is bonded to semiconductor die bond pad 334 on semiconductor die 306, and a second end of bonding wire 332 is bonded to laminate substrate bond pad 336. Thus, bonding wire 332 also provides an electrical connection between semiconductor die bond pad 334 and laminate substrate bond pad 336. Bonding wires 326 and 332 are similar to bonding wire 110 in FIG. 1, and can comprise the same material as bonding wire 110.

As shown in FIG. 3, laminate substrate bond pads 318, 324, 330, and 336 are fabricated on top surface 312 of laminate substrate 302. Laminate substrate bond pads 318, 324, 330, and 336 are similar to laminate substrate bond pad 114 in FIG. 1, and comprises the same material as laminate substrate bond pad 114.

Also shown in FIG. 3, a first end of trace 338 is connected to laminate substrate bond pad 318, and a second end of trace 338 is connected to antenna element 340. Trace 338 is fabricated on top surface 312 of laminate substrate 302, and electrically connects laminate substrate bond pad 318 to antenna element 340. Further shown in FIG. 3, a first end of trace 344 is connected to laminate substrate bond pad 336, and a second end of trace 344 is connected to antenna element 346. Trace 344 is fabricated on top surface 312 of laminate substrate 302, and electrically connects laminate substrate bond pad 336 to antenna element 346. Traces 338 and 344 can comprise aluminum or other metal such as copper.

As shown in FIG. 3, antenna elements 340 and 346 are fabricated on top surface 312 of laminate substrate 302. In another embodiment, antenna elements 340 and 346 can be fabricated on bottom surface 348 of laminate substrate 302. In yet another embodiment, antenna elements 340 and 346 can be fabricated in a metal layer inside laminate substrate 302. Antenna elements 340 and 346 are similar to antenna element 124 in FIG. 1, and can comprise the same materials as antenna element 124. The thickness of antenna elements 340 and 346 can be approximately 25.0 microns.

The shape of antenna elements 340 and 346 can be square. In another embodiment, the shape of antenna elements 340 and 346 can be rectangular. In yet another embodiment, the shape of antenna element 340 can be different from the shape of antenna element 346. The size of antenna elements 340 and 346, respectively, is determined by the desired operating frequency of antenna elements 340 and 346. For example, for a desired operating frequency of 2.0 GHz, each side of antenna elements 340 and 346 can be approximately 8.0 millimeters. Antenna elements 340 and 346 can comprise patch patterns, slot line patterns, meander line patterns, or a combination thereof.

Antenna elements 340 and 346 can be horizontally polarized or vertically polarized. In one embodiment, antenna element 340 may be horizontally polarized and antenna element 346 may be vertically polarized. In such instance, antenna element 340 would capture horizontally polarized radiation and antenna element 346 would capture vertically polarized radiation.

Antenna elements 340 and 346, respectively, are electrically connected to semiconductor die bond pads 316 and 334 by bonding wires 314 and 332, laminate substrate bond pads 318 and 336, and traces 338 and 344. Similar to antenna element 124 in FIG. 1, the input impedance of antenna elements 340 and 346, respectively, can be adjusted to match the output impedance at semiconductor die bond pads 316 and 334 without the use of costly impedance matching circuitry.

Also, similar to antenna element 124 in FIG. 1, antenna elements 340 and 346, respectively, are situated in close proximity to semiconductor dies 304 and 306 on top surface 312 of laminate substrate 302. Accordingly, the line losses generated in the connection between antenna elements 340 and 346, respectively, and semiconductor die bond pads 316 and 334, are effectively minimized. Additionally, by integrating antenna elements 340 and 346 in structure 100, the present invention avoids the cost of having to assemble antenna elements 340 and 344 as discrete components.

Also shown in FIG. 3, mold compound 350 encapsulates and thereby protects semiconductor dies 304 and 306, bonding wires 314, 320, 326, and 332, and antenna elements 340 and 346 from chemical contamination or physical damage during use. Mold compound 350 is similar to mold compound 128 in FIG. 1, and can comprise the same materials as mold compound 128.

Further shown in FIG. 3, laminate substrate ball pads 352, 354, 356, and 358 are fabricated on bottom surface 348 of laminate substrate 302. Laminate substrate ball pads 352, 354, 356, and 358 are similar to laminate substrate ball pads 130, 132, 134, and 136 in FIG. 1, and can comprise the same materials as laminate substrate ball pads 130, 132, 134, and 136. Solder balls 360, 362, 364, and 366, respectively, are situated on laminate substrate ball pads 352, 354, 356, and 358. Solder balls 360, 362, 364, and 366, respectively, can provide an electrical connection between laminate substrate ball pads 352, 354, 356, and 358 and a printed circuit board or other structure not shown in FIG. 3. In another embodiment, "lands" can be fabricated on bottom surface 348 of laminate substrate 302 to electrically connect structure 300 to a printed circuit board. In such instance, the "lands" can be connected to the printed circuit board by solder.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a laminate package embedded antenna has been described.

What is claimed is:

1. A structure comprising:
a laminate substrate having a top surface for receiving a semiconductor die;
an antenna element situated on said top surface of said laminate substrate, said antenna element coupled to a laminate substrate bond pad, said antenna element being coupled to said laminate substrate by a trace on said top surface of said laminate substrate;
a bonding wire providing an electrical connection between said laminate substrate bond pad and a semiconductor die bond pad;
wherein a bottom surface of said laminate substrate is suitable for being electrically connected to a printed circuit board.

2. The structure of claim 1 wherein an input impedance of said antenna element matches an output impedance at said semiconductor die bond pad.

3. The structure of claim 1 wherein said antenna element comprises copper.

4. The structure of claim 1 wherein said antenna element comprises a square metal pad.

5. The structure of claim 1 wherein said antenna element is selected from the group consisting of a slot line pattern, a meander line pattern, and a patch pattern.

6. The structure of claim 1 wherein said laminate substrate comprises an organic laminate material.

7. The structure of claim 1 wherein said laminate substrate comprises a ceramic laminate material.

8. The structure of claim 1 further comprising a capacitor, said capacitor coupled to said antenna element.

9. The structure of claim 8 wherein said capacitor is an embedded capacitor.

10. A structure comprising:
   a laminate substrate having a top surface;
   a first semiconductor die and a second semiconductor die attached to said top surface of said laminate substrate;
   a first antenna element situated on said top surface of said laminate substrate, said first antenna element coupled to a first laminate substrate bond pad;
   a second antenna element situated on said top surface of said laminate substrate, said second antenna element coupled to a second laminate substrate bond pad;
   a first bonding wire providing an electrical connection between said first laminate substrate bond pad and a semiconductor die bond pad on said first semiconductor die;
   a second bonding wire providing an electrical connection between said second laminate substrate bond pad and a semiconductor die bond pad on said second semiconductor die;
   wherein a bottom surface of said laminate substrate is suitable for being electrically connected to a painted circuit board.

11. The structure of claim 10 wherein said first antenna element is coupled to said first laminate substrate bond pad by a trace on said top surface of said laminate substrate.

12. The structure of claim 10 wherein an input impedance of said first antenna element matches an output impedance at said semiconductor die bond pad on said first semiconductor die.

13. The structure of claim 10 wherein said second antenna element is coupled to said second laminate substrate bond pad by a trace on said top surface of said laminate substrate.

14. The structure of claim 10 wherein an input impedance of said second antenna element matches an output impedance at said semiconductor die bond pad on said second semiconductor die.

15. The structure of claim 10 wherein said first antenna element comprises copper.

16. The structure of claim 10 wherein said first antenna element is selected from the group consisting of a slot line pattern, a meander line pattern, and a patch pattern.

17. The structure of claim 10 wherein said second antenna element is selected from the group consisting of a slot line pattern, a meander line pattern, and a patch pattern.

18. The structure of claim 10 wherein said laminate substrate comprises an organic laminate material.

19. The structure of claim 10 further comprising a capacitor, said capacitor coupled to said first antenna element.

* * * * *